(12) United States Patent
Kao (10) Patent No.: US 6,580,640 B2
(45) Date of Patent: Jun. 17, 2003

(54) NON-VOLATILE MEMORY DEVICE WITH TUNNEL OXIDE

(75) Inventor: David Kao, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 144 days.

(21) Appl. No.: 09/801,239

(22) Filed: Mar. 7, 2001

(65) Prior Publication Data

US 2002/0126533 A1 Sep. 12, 2002

(51) Int. Cl.⁷ .................................................. G11C 16/04
(52) U.S. Cl. ............................. 365/185.18; 365/185.14; 365/185.24
(58) Field of Search ....................... 365/185.18, 185.04, 365/185.24, 185.14, 185.26

(56) References Cited

U.S. PATENT DOCUMENTS

| | | | |
|---|---|---|---|
| 6,249,460 B1 | 6/2001 | Forbes et al. | |
| 6,272,047 B1 | 8/2001 | Mihnea et al. | |
| 2001/0040252 A1 | * 11/2001 | Kobayashi et al. | ......... 257/314 |

* cited by examiner

Primary Examiner—Richard Elms
Assistant Examiner—Hien Nguyen
(74) Attorney, Agent, or Firm—Leffert Jay & Polglaze, P.A.

(57) ABSTRACT

A method and apparatus invention that relates to the reduction of leakage current through a tunnel oxide layer of a memory cell to improve data retention. One method of operating a non-volatile memory cell comprises placing electrons on a floating gate of the memory cell and then placing positive charge on a control gate of the memory cell to improve data retention. The positive charge causes the electrons on the floating gate to migrate away from a tunnel oxide layer of the memory cell. In one embodiment, a Flash memory device comprises a memory array of multiple memory cells. Each memory cell comprises a control gate, a floating gate, an inter-gate dielectric layer positioned between the control gate and the floating gate, a substrate, and a tunnel oxide layer positioned between the floating gate and the substrate. Control circuitry is used to control memory operations and couple a positive charge to the control gate of the memory cell to attract electrons on the floating gate of the memory cell away from the tunnel oxide layer of the memory cell.

40 Claims, 4 Drawing Sheets

NON-VOLATILE MEMORY DEVICE WITH TUNNEL OXIDE

TECHNICAL FIELD OF THE INVENTION

The present invention relates generally to non-volatile memories and in particular the present invention relates to the reduction of current leakage through a tunnel oxide layer of a memory cell.

BACKGROUND OF THE INVENTION

Memory devices are typically provided as internal storage areas in the computer. There are several different types of memory. One type of memory is random access memory (RAM) that is typically used as main memory in a computer environment. Most RAM is volatile, which means that it requires a steady flow of electricity to maintain its contents. Computers often contain a small amount of read-only memory (ROM) that holds instructions for starting up the computer. An EEPROM (electrically erasable programmable read-only memory) is a special type non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. A typical Flash memory comprises a memory array that includes a large number of memory cells arranged in a row and column fashion. Each memory cell includes a floating gate field-effect transistor capable of holding a charge. The cells are usually grouped into erasable blocks. Each of the memory cells can be electrically programmed in a random basis by charging the floating gate. The charge can be removed from the floating gate by an erase operation. Thus, the data in a cell is determined by the presence or absence of the charge in the floating gate.

To program a memory cell, a high positive voltage Vg is applied to the control gate of the cell. In addition, a moderate positive voltage is applied to a drain (Vd) and a source voltage (Vs) and substrate voltage (Vsub) are at ground level. These conditions result in the inducement of hot electron injection in a channel region near a drain region of the memory cell. These high-energy electrons travel through the thin gate oxide (tunnel oxide) towards the positive voltage present on the control gate and collect on the floating gate. The electrons remain on the floating gate and function to reduce the effective threshold voltage of the cell as compared to a cell that has not been programmed.

A major concern with memory cells is data retention. That is, how long a programmed cell will retain its programmed state. Electrons placed on the floating gate of a cell by hot electron injection will eventually traverse back across the tunnel oxide over a period of time. When electrons traverse the tunnel oxide during a storage cycle or idle period (a period of time where no other operation is being performed on a programmed cell), the cell is said to have a "leakage current." This leakage current will eventually cause a total discharge of the cell resulting in the loss of programmed data. Thus, it is generally desired to reduce the leakage current during the storage cycle.

The quality of tunnel oxide and the thickness of the tunnel oxide layer determine the rate of leakage current through a tunnel oxide. Generally the thinner the layer of tunnel oxide, the faster the flow of leakage current. Moreover, the reduction in thickness of the layer of tunnel oxide also causes the quality of the tunnel oxide to be degraded thereby increasing the flow of leakage current. In addition, the quality of the tunnel oxide will degrade over time as it becomes subjected to more and more programming and erase operations. A typical thickness of a tunnel oxide layer is around 60 Å. At this thickness, 5 to 9 volts is needed to induce the hot electron injection.

Memory systems that require less energy consumption are desired in the industry. Therefore, a cell with a thinner layer of tunnel oxide is desired since a thinner tunnel oxide layer allows for lower operational voltages to be used in programming the cell. That is, the thinner the tunnel oxide layer, the less voltage is needed to induce hot electron injection.

For the reasons stated above, and for other reasons stated below which will become apparent to those skilled in the art upon reading and understanding the present specification, there is a need in the art for a Flash memory device having memory cells with a thin tunnel oxide layer that reduces leakage current.

SUMMARY OF THE INVENTION

The above-mentioned problems with non-volatile memory devices and other problems are addressed by the present invention and will be understood by reading and studying the following specification.

A method of operating a non-volatile memory cell is disclosed that comprises, placing electrons on a floating gate of the memory cell and then placing positive charge on a control gate of the memory cell to improve data retention. The positive charge causes the electrons on the floating gate to migrate away from a tunnel oxide layer of the memory cell.

Another method of operating a non-volatile memory cell comprises, storing electrons on a floating gate of the memory cell and then supplying a positive voltage on a control gate of the memory cell. The positive voltage attracts the electrons on the floating gate away from a tunnel insulation layer of the memory cell.

A method of operating a memory system comprises, placing non-volatile memory cells in a programmed state, storing positive charge on a control gate of each programmed memory cell to improve data retention, wherein the positive charge causes electrons on a floating gate of each of the programmed memory cells to migrate away from a tunnel oxide layer of each of the programmed memory cells, and powering down the memory system.

A method of operating a non-volatile memory system having blocks of memory cells comprises, storing data in program registers associated with blocks having programmed memory cells and then placing positive charge on control gates of memory cells in blocks having programmed memory cells based on the data stored in the program registers. The positive charge attracts electrons on floating gates of the memory cells away from tunnel oxide layers of the memory cells thereby improving data retention of programmed memory cells.

In one embodiment, a Flash memory device includes a memory array of multiple memory cells and control circuitry. Each memory cell comprises a control gate, a floating gate, an inter-gate dielectric layer positioned between the control gate and the floating gate, a substrate, and a tunnel oxide layer positioned between the floating gate and the substrate. The control circuitry is used to control memory operations and couple a positive charge to the control gate of the memory cell to attract electrons on the floating gate of the memory cell away from the tunnel oxide layer of the memory cell.

In another embodiment, a non-volatile memory device includes a memory array of multiple memory cells, a power supply and a state machine. Each memory cell comprises a control gate, a floating gate, an inter-gate dielectric layer positioned between the control gate and the floating gate, a substrate, and a tunnel oxide layer positioned between the floating gate and the substrate. The state machine is used to control memory operations. Once a memory cell is programmed the state machine directs the power supply to apply a positive voltage to the control gates of the memory cell to attract electrons on the floating gate of the memory cell away from the tunnel oxide layer.

In another embodiment, a non-volatile memory device comprises a memory array having blocks of memory cells, a register for each block of memory cells, a power supply and control circuitry. Each memory cell comprises, a control gate, a floating gate, an inter-gate dielectric layer positioned between the control gate and the floating gate, a substrate, and a tunnel oxide layer positioned between the floating gate and the substrate. The registers are used to store data that indicates when the block contains a programmed memory cell. The control circuitry is used to couple the power supply to control gates of memory cells in blocks having a programmed memory cell in response to the associated register.

In another embodiment, a non-volatile memory device comprises an array of non-volatile memory cells, a plurality of program registers, a power supply and control circuitry. The array of non-volatile memory cells is arranged in erasable blocks, where each erasable block comprises a plurality of sub-blocks. Each program register is associated with one of the sub-blocks. Moreover, each of the program registers is configured to store a data bit when its associated sub-block contains a programmed memory cell. The control circuitry couples a positive voltage from the power supply to control gates of memory cells in sub-blocks in response to the program register.

In another embodiment, a memory device includes a memory array of non-volatile memory cells and control circuitry. Each memory cell comprises a substrate, the substrate having a channel region, a source, a drain, the channel region of the substrate is positioned between the source and the drain, a tunnel oxide layer having a thickness of approximately 30 Å, a first side of the tunnel oxide is positioned adjacent the source, the channel region of the substrate and the drain, a floating gate, the floating gate having a first side positioned adjacent a second side of the tunnel oxide, the floating gate is further position proximate the channel region of the substrate, a portion of the source and a portion of the drain, a control gate, and a inter-gate dielectric layer, the inter-gate dielectric layer is positioned between the control gate and a second side of the floating gate. The control circuitry is used to store a positive charge on the control gates of the memory cells to attract electrons on the floating gate of the memory cell away from the tunnel oxide layer of the memory cell.

In another embodiment, a Flash memory system includes an external processor to provide commands, a memory array of non-volatile memory cells, a power supply and control circuitry. Each memory cell comprises, a control gate, a floating gate, an inter-gate dielectric layer positioned between the control gate and the floating gate, a substrate, and a tunnel oxide layer positioned between the floating gate and the substrate. The control circuitry is used to receive commands from the processor and to control memory operations. Moreover, the control circuitry directs the power supply to place a positive charge on the control gates of programmed memory cells.

DETAILED DESCRIPTION OF THE INVENTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
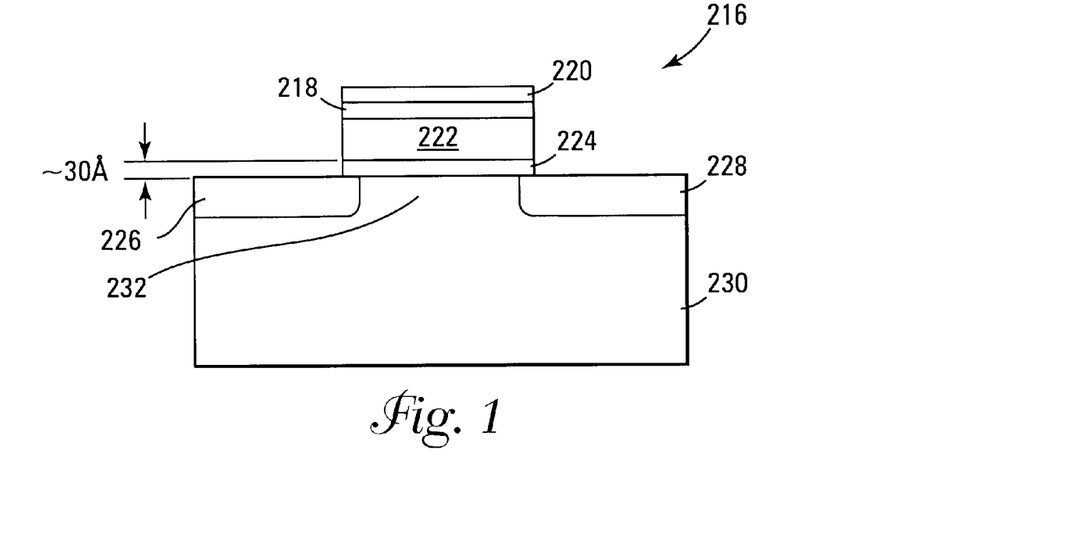
FIG. 1 is a cross sectional diagram of a memory cell of an embodiment of the present invention.

Referring to FIG. 1, a cross-sectional view of one embodiment of a memory cell of the present invention is illustrated. As illustrated, this embodiment includes a control gate 220 and a floating gate 222. An inter-gate dielectric layer 218 is positioned between the control gate 220 and the floating gate 222. This embodiment also has a substrate 230. The substrate 230 has a channel region 232 that is positioned between a source region 226 and a drain region 228. This embodiment is illustrated as having a tunnel oxide layer thickness of approximately 30 Å. The tunnel oxide layer 224 is positioned between the floating gate 222 and the source 226, drain 228 and the channel region 232 of the substrate 230. With a tunnel oxide layer 224 of approximately 30 Å, a voltage as low as 1.8 volts could be used to induce hot electron injection thru the tunnel oxide 224. Although, 224 is described as being an oxide, it will be appreciated by those in the art that other insulating material could be used with the same results and the present invention is not limited to 224 being an oxide and can be referred to as a tunnel insulation layer 224.

Figure 2:
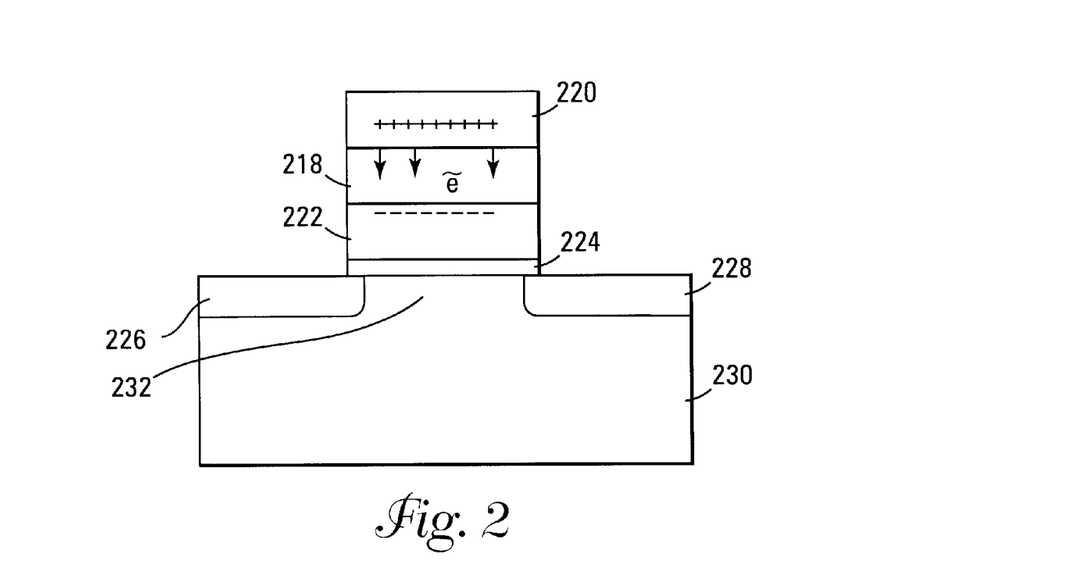
FIG. 2 is a cross sectional diagram of a memory cell of an embodiment of the present invention illustrating a positive charge on the control gate of the cell.

In order to reduce current leakage through a tunnel oxide layer having a thickness of less than 60 Å, the present invention applies a positive charge to the control gate 220 of a memory cell 216 after the cell 216 has been placed in a programmed state. As illustrated in FIG. 2, the positive charge on the control gate 220 creates an electrical field in the inter-gate dielectric layer 218 that causes the electrons in the floating gate 222 to drift towards the control gate 220 and away from the tunnel oxide 224. Since the electrons in the floating gate 222 are pulled away from the tunnel oxide 224 by the electrical field, current leakage is reduced through the tunnel oxide layer 224, thereby extending data retention. Thus, a thinner tunnel oxide layer can be used.

In addition, it will be appreciated by those in the art that the present invention could be used on cells with varying tunnel oxide thickness to extend data retention in the cells, and the present invention is not limited to cells having a tunnel oxide thickness of approximately 30 Å. For example, the present invention will extend the data retention of a cell that has a tunnel oxide layer whose quality has been degraded due to repeated read and erase operations.

In one embodiment of the present invention, the charge placed on the control gate 220 to prevent current leakage through the tunnel oxide layer 224 is only applied during a storage cycle or idle period. Before an operation (i.e., read operation) is applied to the cell 216, the charge placed on the control gate 220 is discharged. This ensures the charge will not interfere with other operations performed on the cell 216.

The present invention can also be applied to non-volatile memory cells that store more than two states. That is, memory cells that are adapted to store varying amounts of electrons on the floating gate to create varying voltage levels, wherein each voltage level represents a predefined type of data. In these memory cells, a positive charge placed on the control gates will help retain the dedicated voltage level during a storage cycle.

Although the electrons on the floating gate 222 are attracted to the control gate 220, current leakage through the inter-gate dielectric layer 218 is minimal. This is because the inter-gate dielectric layer 218 is generally thicker than the tunnel oxide layer 224, and is generally made of high quality isolation material.

Figure 3:
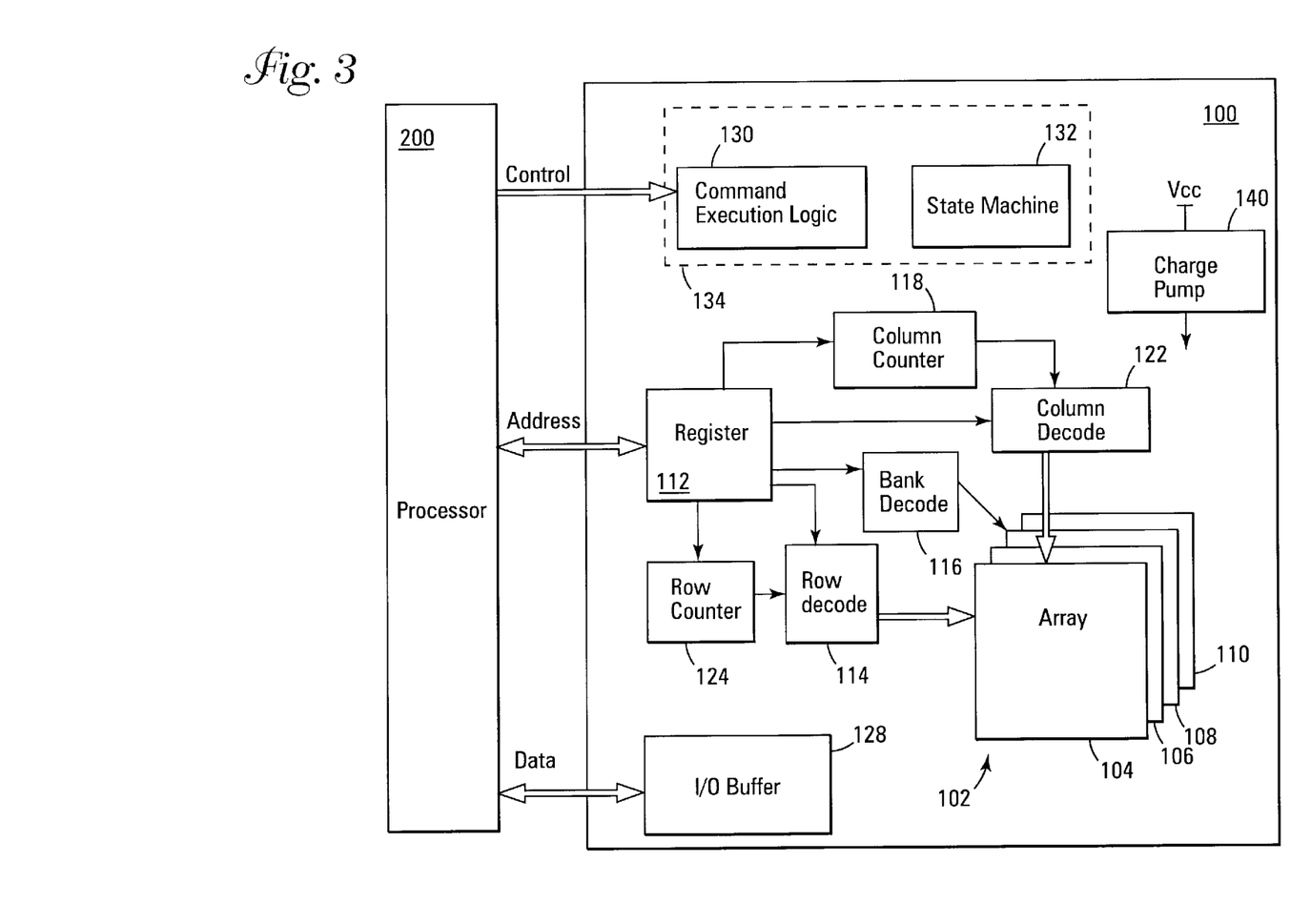
FIG. 3 is a block diagram of one embodiment of a memory system of the present invention.

Referring to FIG. 3, a block diagram of one embodiment of a Flash memory system of the present invention is illustrated. The memory device 100 of the Flash memory system includes an array of non-volatile Flash memory cells 102. The array is arranged in a plurality of addressable banks. In one embodiment, the memory contains four memory banks 104, 106, 108 and 110. Each memory bank contains addressable blocks of memory cells. The data stored in the memory can be accessed using externally provided location addresses received by address register 112 via address signal connections. The addresses are decoded using row decode circuitry 114. Row address counter 124 is also provided. The addresses are also decoded using bank decode logic 116. To access an appropriate column of the memory, column address counter 118 couples addresses to column decode circuitry 122. Data is input and output through I/O circuit 128 via data connections. I/O circuit 128 includes data output registers, an output driver and an output buffer. Command execution logic 130 is provided to control the basic operations of the memory device. A state machine 132 is also provided to control specific operations performed on the memory array and cells. The command circuit 130 and/or state machine 132 can be generally referred to as control circuitry 134 to control read, write, erase and other memory operations. The data connections are typically used for bi-directional data communication. The memory can be coupled to an external processor 200 for operation or testing.

In one embodiment, the control circuitry 134 of the Flash memory 100 directs a charge pump circuit 140 to dump positive charge on the control gates of cells after the cells have been programmed. Although the charge on the control gates will eventually leak out or neutralize over a period of time, during the time the charge is present on the control gates, the current leakage through the tunnel oxide is reduced thereby enhancing data retention. Before an operation is applied to one of the cells having a charge on the control gate, the control circuitry 134 discharges the control gate of the cell.

In another embodiment, the control circuitry directs the charge pump circuit 140 to couple positive charge on the cells at power down of the system. That is, once the control circuitry receives a signal from the external processor that the system is shutting down, the control circuitry directs the charge pump circuit to couple positive charge on the control gates of cells in a programmed state. Although, this embodiment is described as using the charge pump circuit 140 as an internal power source to couple positive charge on the control gates of memory cells at power down, it will be appreciated in the art that other elements in a memory device that have charge that is discharged at power down could also be used for the same purpose. Accordingly, the present invention is not limited to the charge pump circuit 140 providing positive charge on the control gates.

Figure 4:
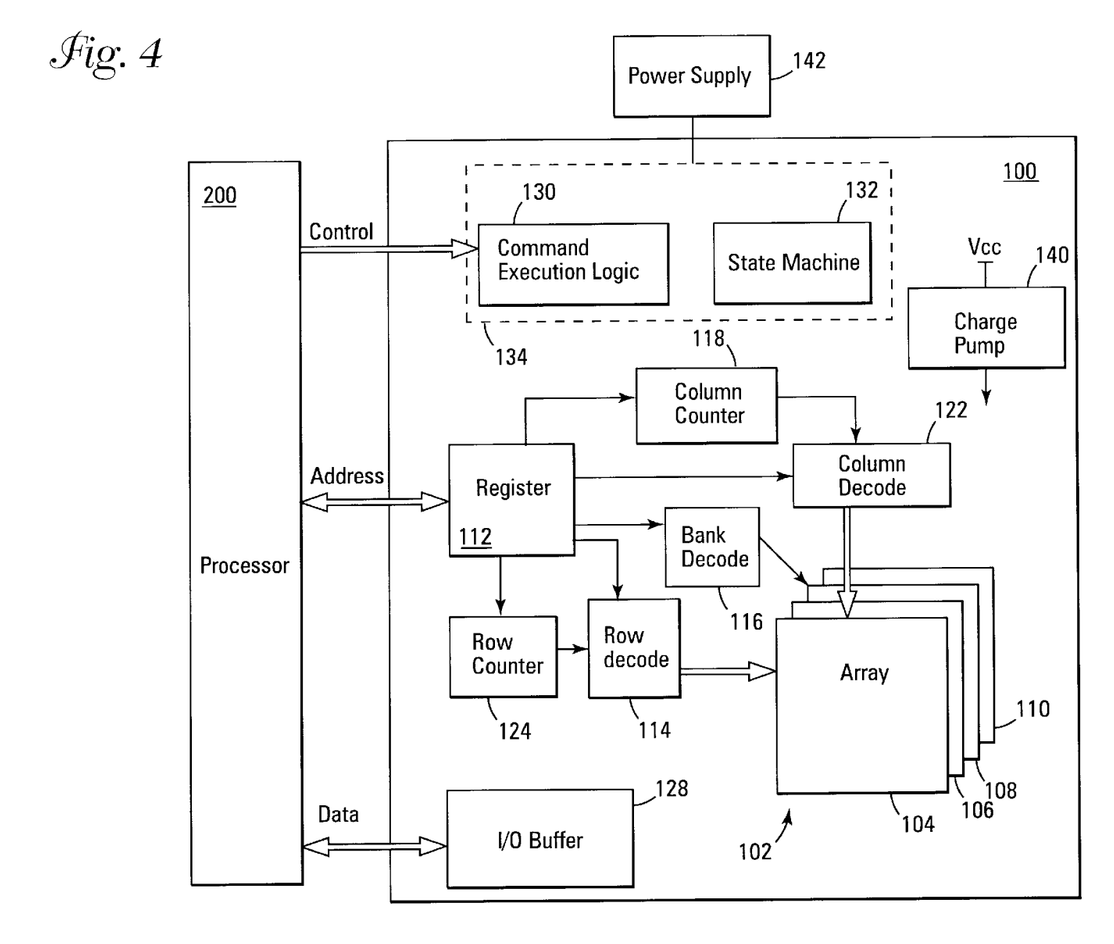
FIG. 4 is a block diagram of one embodiment of a memory system of the present invention.

In yet another embodiment, an external power source 142 is used to provide a low voltage charge to the control gates of programmed cells. The external power source is illustrated in FIG. 4. In this embodiment, either a steady voltage is applied to the control gates or a periodic charge is applied to the control gates of cells to reduce current leakage during a storage cycle. The control circuitry 134 or state machine 132 of the memory device controls the application of the external power supply 142 to the memory cells. The control circuitry 134 also directs the removal of the power source from the control gates of programmed cells and the discharge of the control gates before an operation is applied.

Figure 5:
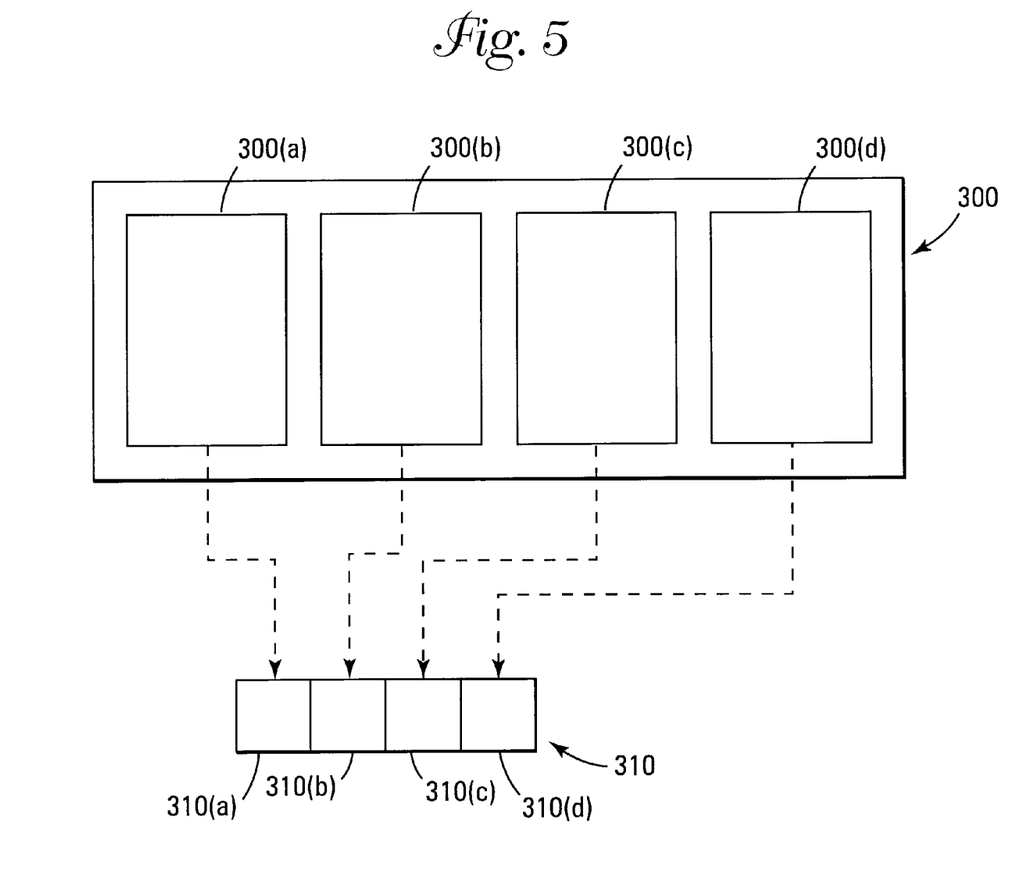
FIG. 5 is a block diagram of a block of memory and a program register of one embodiment of the present invention.

The memory cell array of a non-volatile memory is typically arranged in erasable blocks. Moreover, the erasable blocks can further be arranged in individually erasable sub-blocks. For example, a 16 Meg memory array can be arranged in four erasable blocks of 4 Meg, where each of these blocks contain 16 sub-blocks. Referring to FIG. 5, four sub-blocks 300(a)–(d) of a memory block 300 are illustrated. Typically, a memory cell array has blocks or sub-blocks of cells containing no programmed cells. Providing charge to the control gates of those cells is not necessary and is a waist of energy.

Referring to FIG. 5, in one embodiment of the present invention, a program register 310 is provided in the memory that has bits 310(a)–(d), or storage locations, that correspond to each sub-block. The register 310 is used to indicate the sub-blocks having programmed cells. If a sub-block includes a cell that is programmed, an associated program register stores a bit or data that indicates the sub-block has a programmed cell. The control circuitry 134 or state machine 132 of this embodiment then uses this bit or data to selectively direct charge to control gates of cells in sub-blocks having programmed cells. In the embodiment that uses an external power supply to charge the control gates of cells, power consumption is reduced by not supplying external power to the control gates of blocks or sub-blocks of non-programmed cells. In the embodiments that dump charge on the control gates, more charge can be directed to the control gates of cells in blocks or sub-blocks having programmed cells. That is, charge that would be wasted on blocks or sub-blocks not having programmed cells is directed to blocks or sub-blocks having programmed cells.

CONCLUSION

A method and apparatus invention has been disclosed that relates to the reduction of leakage current through a tunnel oxide layer of a memory cell to improve data retention. One method of operating a non-volatile memory cell comprises placing electrons on a floating gate of the memory cell and then placing positive charge on a control gate of the memory cell to improve data retention. The positive charge causes the electrons on the floating gate to migrate away from a tunnel oxide layer of the memory cell. In one embodiment, a Flash memory device comprises a memory array of multiple memory cells. Each memory cell comprises a control gate, a floating gate, an inter-gate dielectric layer positioned between the control gate and the floating gate, a substrate, and a tunnel oxide layer positioned between the floating gate and the substrate. Control circuitry is used to control memory operations and couple a positive charge to the control gate of the memory cell to attract electrons on the floating gate of the memory cell away from the tunnel oxide layer of the memory cell.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of operating a non-volatile memory cell comprising:

placing electrons on a floating gate of the memory cell; and placing positive charge on a control gate of the memory cell to improve data retention, wherein the positive charge causes the electrons on the floating gate to migrate away from a tunnel oxide layer of the memory cell.

2. The method of claim 1 wherein the positive charge is placed on the control gate by an external power source.

3. The method of claim 1 further comprising:

removing the positive charge from the control gate; and performing an operation the memory cell.

4. The method of claim 3 wherein the operation performed on the memory cell is a read operation.

5. The method of claim 3 wherein the operation performed on the memory cell is an erase operation.

6. A method of operating a non-volatile memory cell comprising:

storing electrons on a floating gate of the memory cell; and supplying a positive voltage on a control gate of the memory cell, wherein the positive voltage attracts the electrons on the floating gate away from a tunnel insulation layer of the memory cell.

7. The method of claim 6 further comprises:

removing the voltage from the control gate of the memory cell;

discharging the control gate of the memory cell; and reading the memory cell.

8. The method of claim 6 wherein the positive voltage is supplied by an external power supply.

9. A method of operating a memory system comprising:

placing non-volatile memory cells in a programmed state;

storing positive charge on a control gate of each programmed memory cell to improve data retention, wherein the positive charge causes electrons on a floating gate of each of the programmed memory cells to migrate away from a tunnel oxide layer of each of the programmed memory cells; and powering down the memory system.

10. The method of claim 9 wherein storing the positive charge further comprises, discharging circuitry within the memory system having a charge to the control gates of the programmed memory cells before power down.

11. A method of operating a non-volatile memory system having blocks of memory cells comprising:

storing data in program registers associated with blocks having programmed memory cells; and placing positive charge on control gates of memory cells in blocks having programmed memory cells based on the data stored in the program registers, wherein the positive charge attracts electrons on floating gates of the memory cells away from tunnel oxide layers of the memory cells thereby improving data retention of programmed memory cells.

12. The method of claim 11 wherein positive charge is not applied to control gates of memory cells in blocks not having programmed memory cells.

13. The method of claim 11 wherein the charge is placed on the control gates of memory cells in blocks having programmed memory cells by an internal power source.

14. The method of claim 11 wherein the charge is placed on the control gates of memory cells in blocks having programmed memory cells by an external power source.

15. A Flash memory device comprising:

a memory array of multiple memory cells, each memory cell comprising:

a control gate, a floating gate, an inter-gate dielectric layer positioned between the control gate and the floating gate, a substrate, and a tunnel oxide layer positioned between the floating gate and the substrate; and control circuitry to control memory operations and couple a positive charge to the control gate of the memory cell to attract electrons on the floating gate of the memory cell away from the tunnel oxide layer of the memory cell.

16. The Flash memory device of claim 15 wherein the control circuitry couples a power supply to provide the positive charge.

17. The Flash memory device of claim 16 wherein the power supply is external from the device.

18. The Flash memory device of claim 15 wherein the control circuitry couples a charge pump to the control gates at power down of the Flash memory device.

19. A non-volatile memory device comprising:

a memory array of multiple memory cells, each memory cell comprising:

a control gate, a floating gate, an inter-gate dielectric layer positioned between the control gate and the floating gate, a substrate, and a tunnel oxide layer positioned between the floating gate and the substrate;

a power supply; and a state machine to control memory operations, wherein once a memory cell is programmed the state machine directs the power supply to apply a positive voltage to the control gates of the memory cell to attract electrons on the floating gate of the memory cell away from the tunnel oxide layer.

20. The non-volatile memory device of claim 19 wherein the state machine disconnects the power supply and discharges any charge on the control gate before reading the memory cell.

21. The non-volatile memory device of claim 19 wherein a thickness of the tunnel oxide layer is less than 60 Å.

22. The non-volatile memory device of claim 19 wherein a thickness of the tunnel oxide layer is less than about 30 Å.

23. A non-volatile memory device comprising:
  a memory array having blocks of memory cells, each memory cell comprising:
    a control gate,
    a floating gate,
    an inter-gate dielectric layer positioned between the control gate and the floating gate,
    a substrate, and
    a tunnel oxide layer positioned between the floating gate and the substrate;
  a register for each block to store data that indicates when the block contains a programmed memory cell;
  a power supply; and
  control circuitry to couple the power supply to control gates of memory cells in blocks having a programmed memory cell in response to the associated register.

24. The non-volatile memory device of claim 23 wherein the power supply is not coupled to control gates of memory cells in blocks that have no programmed memory cells.

25. The non-volatile memory device of claim 23 wherein control gates are discharged before reading the memory cells.

26. A non-volatile memory device comprising:
  an array of non-volatile memory cells arranged in erasable blocks, where each erasable block comprises a plurality of sub-blocks;
  a plurality of program registers each associated with one of the sub-blocks, each of the program registers is configured to store a data bit when its associated sub-block contains a programmed memory cell;
  a power supply; and
  control circuitry to couple a positive voltage from the power supply to control gates of memory cells in sub-blocks in response to the program register.

27. The non-volatile memory device of claim 26 wherein the positive voltage is provided by a charge pump.

28. The non-volatile memory device of claim 26 wherein the positive voltage is provided during a storage cycle.

29. A memory device comprising;
  a memory array of non-volatile memory cells, each memory cell comprising;
    a substrate, the substrate having a channel region,
    a source,
    a drain, the channel region of the substrate is positioned between the source and the drain,
    a tunnel oxide layer having a thickness of approximately 30 Å, a first side of the tunnel oxide is positioned adjacent the source, the channel region of the substrate and the drain,
    a floating gate, the floating gate having a first side positioned adjacent a second side of the tunnel oxide, the floating gate is further position proximate the channel region of the substrate, a portion of the source and a portion of the drain,
    a control gate, and
    a inter-gate dielectric layer, the inter-gate dielectric layer is positioned between the control gate and a second side of the floating gate; and
  control circuitry to store a positive charge on the control gates of the memory cells to attract electrons on the floating gate of the memory cell away from the tunnel oxide layer of the memory cell.

30. The memory device of claim 29 wherein the positive charge is stored on the control gates of the memory cells when the memory cells are not being read or erased.

31. The memory device of claim 29 wherein the control circuitry uses an external power supply to store the positive charge on the control gates.

32. The memory device of claim 29 wherein the control circuitry uses an internal power supply to store the positive charge on the control gates.

33. A Flash memory system comprising:
  an external processor to provide commands;
  a memory array of non-volatile memory cells, each memory cell comprising:
    a control gate,
    a floating gate,
    an inter-gate dielectric layer positioned between the control gate and the floating gate,
    a substrate, and
    a tunnel oxide layer positioned between the floating gate and the substrate,
  a power supply; and
  control circuitry to receive commands from the processor and to control memory operations, wherein the control circuitry directs the power supply to place a positive charge on the control gates of programmed memory cells.

34. The non-volatile memory system of claim 33 wherein the positive charge on the control gates of programmed memory cells attracts electrons on associated floating gates away from an associated tunnel oxide layer thereby deterring current leakage through the tunnel oxide layer.

35. The non-volatile memory system of claim 33 wherein the power supply places charge on the control gates of programmed memory cells when the control circuitry receives a power down command from the processor.

36. The non-volatile memory system of claim 33 wherein the positive charge is continually placed on the control gates of programmed memory cells during a storage cycle.

37. A method of operating a non-volatile memory cell comprising:
  placing electrons on a floating gate of the memory cell; and
  placing a positive charge on a control gate of the memory cell using a charge pump to improve data retention, wherein the positive charge causes the electrons on the floating gate to migrate away from a tunnel oxide layer of the memory cell.

38. A method of operating a non-volatile memory cell comprising:
  storing electrons on a floating gate of the memory cell; and
  supplying a positive voltage on a control gate of the memory cell, wherein the positive voltage attracts the electrons on the floating gate away from a tunnel insulation layer of the memory cell to reduce current leakage across the tunnel insulation layer.

39. A method of operating a memory system comprising:
  placing non-volatile memory cells in a programmed state;
  discharging a charge pump, prior to power-down, to store a positive charge on a control gate of each programmed memory cell to improve data retention, wherein the positive charge causes electrons on a floating gate of each of the programmed memory cells to migrate away from a tunnel oxide layer of each of the programmed memory cells; and powering down the memory system.

40. A Flash memory device comprising:

a memory array of multiple memory cells, each memory cell comprising:
  a control gate,
  a floating gate,
  an inter-gate dielectric layer positioned between the control gate and the floating gate,
  a substrate, and
  a tunnel oxide layer positioned between the floating gate and the substrate; and control circuitry to control memory operations and couple a charge pump to the control gate of the memory cell to deposit a positive charge that attracts electrons on the floating gate of the memory cell away from the tunnel oxide layer of the memory cell.

* * * * *